United States Patent
Hui et al.

[11] Patent Number: 6,136,667
[45] Date of Patent: Oct. 24, 2000

[54] METHOD FOR BONDING TWO CRYSTALLINE SUBSTRATES TOGETHER

[75] Inventors: Sanghee Park Hui, New Providence; Barry Franklin Levine, Livingston; Christopher James Pinzone, Basking Ridge; Gordon Albert Thomas, Princeton, all of N.J.

[73] Assignee: Lucent Technologies Inc., Murray Hill, N.J.

[21] Appl. No.: 09/369,682

[22] Filed: Aug. 5, 1999

Related U.S. Application Data

[63] Continuation-in-part of application No. 09/204,047, Dec. 2, 1998, which is a continuation-in-part of application No. 08/947,175, Oct. 8, 1997, Pat. No. 5,966,622.

[51] Int. Cl.[7] .................................................. H01L 21/30
[52] U.S. Cl. .......................... 438/459; 438/458; 438/977; 438/455; 257/623
[58] Field of Search ..................................... 438/455, 745, 438/458, 977; 156/630, 633; 257/623

[56] References Cited

U.S. PATENT DOCUMENTS

| | | | |
|---|---|---|---|
| 4,983,251 | 1/1991 | Haisma et al. | 156/630 |
| 5,164,813 | 11/1992 | Blackstone et al. | 257/623 |
| 5,207,864 | 5/1993 | Bhat et al. | 156/633 |
| 5,346,848 | 9/1994 | Grupen-Shemansky et al. | 437/61 |
| 5,391,257 | 2/1995 | Sullivan et al. | 156/630 |
| 5,932,048 | 8/1999 | Furukawa et al. | 156/153 |
| 5,981,400 | 11/1999 | Lo | 438/745 |

OTHER PUBLICATIONS

Chung et al. "Wafer Direct Bonding of Compound Semiconductors . . . Bonding Method", Applied Surface Science 117/118 (1997),p.808–812.
Kagawa, T. et al., "In Situ Wafer Bonding of an InP/InGaAs Epitaxial Wafer . . . Chamber", App. Phys. Let., 69 (20), p. 3057–59.
Hawkins et al., "Silicon Heterointerface Photodetector", App. Phys., Lett., 68 (26), p. 3692.
Hawkins et al., "High Gain–Bandwidth–Product Silicon Heterointeface Photodetector", App. Phys. Lett., 70 (03), p. 303.

*Primary Examiner*—John F. Niebling
*Assistant Examiner*—Viktor Simkovic
*Attorney, Agent, or Firm*—Mathews, Collins, Shepherd & Gould, P.A.

[57] ABSTRACT

A process for device fabrication is disclosed in which two substrates having different crystal lattices are bound together. In the process the substrate surfaces are thoroughly cleaned and placed in physical contact with each other. The duration of the contact and the pressure of the contact are selected to facilitate a bond between the two substrate surfaces that results from attractive Van der Waals' forces between the two surfaces. The bonded substrates are heated to a moderate temperature to effect escape of gases which may be entrapped by the substrates. The bulk of one of the substrates is then typically removed. The substrates can be heated again to a moderate temperature to effect removal of any gases remaining entrapped on the substrates. Thereafter, the bonded surfaces are heated to a high temperature to effect a permanent bond.

7 Claims, 1 Drawing Sheet

METHOD FOR BONDING TWO CRYSTALLINE SUBSTRATES TOGETHER

CROSS-REFERENCE TO RELATED APPLICATION

This application is a continuation in part of U.S. Ser. No. 09/204,047, filed Dec. 2, 1998 and entitled "Process for Bonding Crystalline Substrates With Different Crystal Lattices" which is a continuation in part of U.S. Ser. No. 08/947,175, filed Oct. 8, 1997 now U.S. Pat. No. 5,966,622, and entitled "Process for Bonding Crystalline Substrates With Different Crystal Lattices."

BACKGROUND OF THE INVENTION

1. Technical Field

The present invention is directed to processes for fabricating devices, such as photodetector devices, in which two crystalline substrates with different crystal lattices are bound together.

2. Art Background

Processes for fabricating certain semiconductor devices require that two wafers, each having a crystal lattice that is different from the other, be bound together. For example crystalline III–V substrates (e.g. substrates of Indium Phosphide (InP) and Indium Gallium Arsenide (InGaAs)) substrates are bound to crystalline silicon substrates to fabricate photodetectors. Such devices are described in Hawkins, A., et al., "Silicon heterointerface photodetector," *Appl. Phys. Lett.*, Vol. 68:26, pp. 3692–3694 (1996) (hereinafter Hawkins et al.). As used herein, III–V substrates are semiconductor compounds in which one of the elements is from column III of the Mendeleef Periodic Table and one of the elements is from column V of that Table.

Hawkins et al. describe a process for fabricating avalanche photodetector devices in which a silicon wafer is fused directly to an InGaAs surface of an indium phosphide (InP) substrate. In the Hawkins et al. process, an InGaAs surface is epitaxially grown on the InP substrate. The bonding surface of the silicon wafer is an epitaxial silicon layer grown on an n+ substrate with a shallow p-type implant at the surface. After bonding, the InP substrate is subsequently removed leaving only the InGaAs layer and the other thin device layers bound to the silicon substrate. The bonding is performed by pressing the surfaces of the two substrates together for 20 minutes at 650° C. in an $H_2$ atmosphere.

The epitaxial layers of the resulting device 10 are illustrated in FIG. 1. Starting from the topmost epitaxial layer, there is a p+-doped InGaAs layer 20, which is used for ohmic contact. Underlying layer 20 is the intrinsic InGaAs layer 25, which is used for photon absorption. Layer 25 is fused to layer 30, which is an n-type silicon implanted with boron. Layer 30 functions as a multiplication region for the detector.

After the above-described structure is formed, the epitaxial layers 20 and 25 are etched to form isolated devices. To isolate the devices, a patterned metal mask layer 60 of Au/Zn is formed over layer 20 and the portions of layers 20 and 25 not covered by the mask are etched away. Layer 60 is a top p-type contact. After etching, a dielectric layer 70 is formed on the sidewalls of the remaining portions of layers 20 and 25. An n-type metal contact layer 80 is formed on the exposed portion 85 of the silicon substrate 30.

Hawkins et al. states that the device described therein shows potential for high speed, high gain operation. However, the quality of the devices depends on, among other things, the quality of the silicon-InGaAs interface. Accordingly, a process for forming a high quality interface between the two different surfaces is desired.

SUMMARY OF THE INVENTION

The present invention is a process for bonding together two substrates (typically semiconductor wafers) each substrate having a crystal lattice structure that is different from the other. The invention is further directed to a process for device fabrication in which a first substrate with a first crystal lattice structure is bound to a second substrate with a second crystal lattice structure. In the context of the present invention, a difference in lattice constant that is greater than about 0.1 percent qualifies as a different crystal lattice.

In the process of the present invention, the first and second substrates are cleaned. The cleaned substrates are then placed into a chamber and the chamber is then filled with an inert gas such as nitrogen. The substrates are then cleaned again to remove any oxide or particle contamination from the surface of the wafers. Dipping the substrates in an aqueous solution of hydrofluoric acid (ten-percent hydrofluoric acid) is contemplated as suitable.

The substrates are then placed together and held together with at least a small amount of force. As used herein, a small amount of force is about 1 to about 10 pounds of force. The present invention does not preclude the use of greater amounts of force to hold the two substrates together. However, the amount of force is limited to an amount that will not deform or damage the substrates. The wafers are held together for a sufficient amount of time for an attractive force to develop between the two wafers. This attractive force, referred to herein as Van der Waals force, develops sufficiently when the wafers are held together for about five to about thirty minutes.

After the two substrates are Van der Waals' bound together, but before they are heated to effect a covalent bond, a portion of one of the substrates is typically removed prior to device fabrication. For example, in the context of the photodetector devices previously described, it is desired to bond a silicon substrate to a III–V device layers such as InGaAs device layers formed on a III–V semiconductor substrate (e.g. an InP substrate). The bulk of either the first substrate or the second substrate is etched away after the substrates are Van der Waals bound together. Only one or more discrete, thin layers formed on the removed substrate remain bound to the other substrate. In order to ensure that the desired device layer(s) remain, an etch stop layer is formed on the III–V substrate. Examples of etch stop layers that are suitable for stopping the etch of a bulk III–V semiconductor substrate are InAϑAs and InGaAs.

It is advantageous to avoid exposing the wafers to high pressure and high temperature, especially when the bulk of both substrates are physically attached to the device layers. Large (greater than 100° C.) temperature variations are preferably avoided because the mismatch in the coefficient of thermal expansion between the first substrate and the second substrate causes the two substrates, when bound together, to expand or contract by significantly different amounts in response to temperature variations. These unequal rates of expansion will introduce strains into the substrates that, in turn, can cause the substrates to crack.

In the process of the present invention, such strains are prevented by removing the bulk of the III–V substrate (e.g. the InP portion), leaving only the layer(s) formed thereon (e.g., the InGaAs layers formed thereon), before subjecting the bound surfaces to the higher temperatures needed to effect a covalent bond between the two surfaces. For example, after the bulk of one substrate is removed leaving only the layer(s) formed thereon bound to the other substrate, the structure is heated to a temperature sufficient to induce a covalent bond between the device layer(s) and the other substrate. The temperature and duration of the heating step are largely a matter of design choice and will depend upon the material characteristics of the device layer (s) and the substrate. In the embodiment wherein the device layer(s) are InGaAs and the substrate is a silicon substrate, heating the structure to a high temperature in the range of about 630° to about 650° C. for about 15 minutes to about 30 minutes is adequate to obtain a bond of the desired strength.

It has been found that there may be gases or liquids entrapped on the substrates as a result of the cleaning steps. During removal of a portion of one of the substrates after the substrates are Van der Waals bound together or during covalent bonding of the substrates, the gases or liquids can be released, thereby forming undesirable bubbles in the substrates. In the process of the present invention, before cleaning the substrates, a pattern is etched in at least one surface of the first and second substrates. The pattern provides an irregular surface that allows gas to escape when the substrates are pressed together. After the two substrates are Van der Waals' bound together, before a portion of one of the substrates is removed or before the substrates are heated to a high temperature to effect a covalent bond, the Van der Waals' bound substrates are heated to a low temperature sufficient to enhance gas escape from the substrates. The temperature and duration of the gas escape heating step are largely a matter of design choice and will depend upon the material characteristics of the substrates. Typically the low temperature is less than 100° C., the boiling point of water. Heating the Van der Waals' bound substrates to a low temperature in the range of about 30° C. to about 90° C. for about 10 minutes to 30 minutes is typically adequate to obtain gas escape.

DETAILED DESCRIPTION

Figure 1:
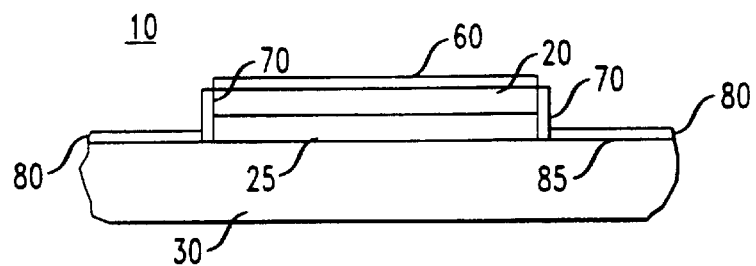
FIG. 1. illustrates a conventional structure for photodetector devices.

As previously described, the invention is directed to a process for bonding two crystal substrates, each having a crystal lattice constant different from the other, together. One problem associated with bonding two such substrates together are the strains introduced into the substrates in the regions adjacent to the bond that arise from the lattice mismatch between the two substrates. These strains create interface states, defects, and traps. The presence of these interface states, defects, and traps adversely affects device performance. Another problem that occurs during bonding of substrates together is the introduction of bubbles in the substrates from gases released from the substrates during removal of a device layer from the substrates by gases released during covalent bonding.

In the present invention, a first substrate having a first crystal lattice is bound to a second substrate having a second crystal lattice utilizing Van der Waals' force to hold the bonding surfaces together. The surfaces (e.g., III–V device layer(s) formed on a sacrificial III–V bulk substrate and a silicon substrate) that are to be bound together are first cleaned to remove contamination and oxides from their surfaces. The cleaning conditions for the surface of the device layer(s) are selected so that the cleaned device layer(s) surface is substantially free of contamination, substantially smooth, and has a stoichiometry that is substantially identical to the non-surface portion of the device layer. This means that the surface of the device layer(s) is relatively free of impurity (e.g. oxides). This also means that the relative amounts of the Group III and Group V elements in the surface is similar to the relative amounts of those elements in the nonsurface portion of the device layer. Various combinations of conventional cleaning expedients are contemplated as suitable for achieving these objectives.

After the substrates are cleaned, they are placed in a chamber that isolates the substrates from the ambient atmosphere and yet allows the substrates to be moved within the chamber. A conventional glove box is suitable for this purpose.

After the substrates are placed in the chamber, the chamber is evacuated and an inert atmosphere is introduced. An inert atmosphere is an atmosphere that does not contain constituent gases that react with the substrate materials. A nitrogen atmosphere is suitable for this purpose.

The surfaces of the substrates are then cleaned again. Conventional cleaning expedients are contemplated as suitable. The substrate surfaces are then placed in contact with one another and held together for a period of time that is sufficient for the substrates to be held together by Van der Waals' force. The present process is advantageous because only a small amount of pressure need be placed upon the substrates in order to effect the desired Van der Waals' bonding. Pressures as low as about 1–10 lbs. are suitable. Although higher pressures are not precluded by the present invention, they are not required. The substrates are held together for some time, typically about 5 to about 30 minutes, in order for Van der Waals bonding to occur.

The bulk of the III–V substrate is then removed by etching. Either dry etching or wet etching expedients are contemplated as suitable. One example of a suitable wet etch expedient is a spray of aqueous hydrochloric acid (HCl). In order to stop the etch before the device layer(s) are removed, the III–V substrate has an etch stop layer formed thereon (e.g. InGaAs) which prevents the etch from progressing to the device layer(s). The structure is then heated to effect a covalent bond between the III–V surface and the surface of the silicon substrate. Conditions suitable for effecting a covalent bond (i.e. temperature and duration) are well known to one skilled in the art. Exemplary conditions are a temperature in the range of about 630° C. to about 650° C. for about 15 to about 30 minutes.

Crystal substrates with different crystal lattices are bound together to form a variety of devices, one example of which is an avalanche photodetector device. In the avalanche photodetector device, there is a III–V substrate for the absorption of light and the generation of carriers. The carriers are multiplied in the silicon substrate, which results in the amplification of the electrical signal generated by the device. For convenience herein, the first substrate is referred to as the silicon substrate and the second substrate is referred to as the III–V substrate. However, since the invention is directed to bonding two surface with different crystal lattices, the invention is not limited to these specific materials.

Figure 2:
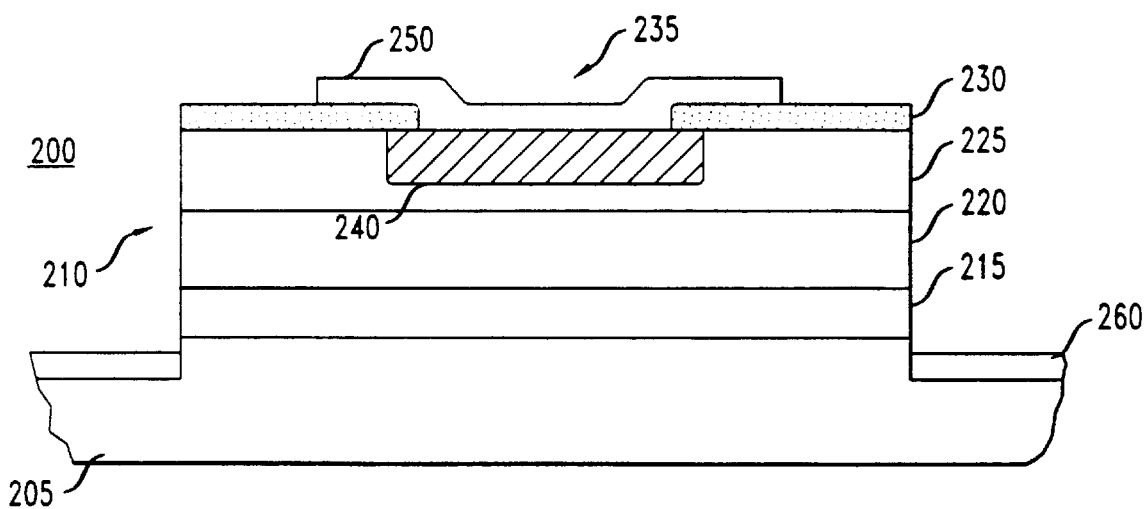
FIG. 2 is a schematic side view of a device formed by the present invention.

One example of an avalanche detector is illustrated in FIG. 2. The device 200 illustrated in FIG. 2 is formed on an n+ silicon substrate 205. A patterned stack of materials 210 forms the device 200. The patterned stack is layer of n-silicon 215 on which is formed a layer of n-InGaAs 220, a layer of InP 225, a layer of silicon dioxide ($SiO_2$) 230, and a layer of p-type metal 250 (e.g. gold-beryllium alloy). A window 235 was formed in the $SiO_2$ layer 230 in stack 210 and zinc was diffused therein to form the p-n junction 240. The n-contact 260 is aluminum. Other structures for avalanche detectors are well known to one skilled in the art.

The above-described device is prepared by forming one or more InGaAs and InP layers on an InP substrate. The one or more InGaAs and InP (or other suitable III–V materials) layers are referred to as device layers. Before the InGaAs device layers are formed on the InP substrate an etch stop layer is formed thereon to isolate and protect the device layers from the etchant used to remove the bulk of the InP substrate during subsequent processing. Suitable materials for such an etch stop are well known to one skilled in the art. Examples of suitable etch stop materials include InGaAs.

The InGaAs or InP layers are grown on the InP substrate using conventional CVD techniques. Typically the InGaAs or InP layers have a thickness of about 0.05 $\mu$m to about 5 $\mu$m. After the InGaAs layers are formed on the substrate, the substrate is maintained at a temperature below 500° C. to avoid depleting arsenic from the InGaAs.

As previously noted, the surfaces of the substrates are cleaned prior to being placed in contact with each other. Although conventional cleaning expedients are contemplated as suitable, the following cleaning sequence was found to adequately clean substrate surfaces for subsequent Van der Waals bonding. The following example is provided to illustrate the present invention.

Example 1

Before placing the surface of a silicon substrate in contact with the above-described InP substrate with a layer of InGaAs formed thereon, the surfaces of both substrates were cleaned. The silicon surface was cleaned using the following sequence:

1. swabbing the silicon substrate with cotton soaked with isopropyl alcohol to remove dust;
2. boiling the silicon substrate in acetone for five minutes;
3. rinsing the silicon surface in deionized water;
4. repeating steps 2 and 3;
5. boiling the silicon substrate in isopropyl alcohol for five minutes; and
6. rinsing the silicon surface in deionized water.

The silicon substrate was then immersed in a 1:1 solution of $H_2SO_4:H_2O_2$ to remove articles from the surface. The surface was then subsequently rinsed with deionized water for ten minutes.

The silicon substrate was then cleaned using a standard wafer cleaning process known as RCA1. This process removes resist and particles from the surface of the silicon substrate. The substrate was boiled (80° C.) in the RCA1 solution (100 @ deionized water; 25 @ $NH_4OH$; 25 ml $H_2O_2$ in which the $H_2O_2$ was added after the deionized water and the $NH_4OH$ boiled). The substrate was then rinsed in deionized water for 10 minutes.

The substrate was then placed in an aqueous solution of hydrofluoric acid (1 part by volume of 50% HF and 10 parts by volume water) and then rinsed in deionized water for ten minutes. The RCA1-rinse cycle was then repeated, and the silicon substrate was blown dry.

The InGaAs surface of the InP substrate was also cleaned using the following procedure. First the InGaAs surface was swabbed with cotton soaked with isopropyl alcohol to remove dust. The substrate was then boiled in acetone for five minutes. The substrate was then boiled in a new acetone solution for another five minutes. The substrate was then boiled in isopropyl alcohol for five minutes. The InGaAs surface was then subjected to UV ozone cleaning for 10 minutes after which the substrate was placed in an aqueous solution of hydrofluoric acid (1 part $H_2O$ to 4 parts HF (10%)). The InGaAs surface was then rinsed in DI water for 30 seconds and subsequently blow-dried. The InGaAs surface was then exposed to UV ozone cleaning for another 10 minutes.

Both of the cleaned substrates were then placed in a "glove box" (i.e. a container in which the contents inside are capable of being manually manipulated using gloves mounted on the side thereof). The atmosphere inside glove box was evacuated and replaced with nitrogen gas. The InGaAs substrate was then placed in an aqueous solution of hydrofluoric acid for 30 seconds to remove any oxides that had formed on the surface. The InGaAs substrate was then subsequently rinsed in deionized water and blow-dried (using nitrogen gas). The silicon substrate was placed in the aqueous solution of HF for 30 seconds, after which the substrate was blow-dried (using nitrogen gas).

The two cleaned wafer surfaces were then placed in physical contact with each other. About 1 to 10 lbs. of force was applied to ensure good physical contact. After about 5 to about 30 minutes, the two wafers were removed from the glove box and placed in an HCl etcher to removed the bulk InP portion of the InGaAs substrate. The resulting structure was then heated in a flowing hydrogen atmosphere to a temperature of about 630° C. to about 650° C. for about 15 to 30 minutes.

In certain embodiments, it is advantageous to pattern one of the two substrate surfaces prior to bonding. The pattern provides an irregular surface that allows gas to escape when the surfaces are pressed together. One example of a suitable pattern is a series of lines and spaces wherein the width of the lines is about 1 $\mu$m to about 50 $\mu$m and the depth of the pattern into the substrate is in the range of about 0.1 $\mu$m to about 1 $\mu$m. If the patterned surface is the surface on which the thin layer is grown, the surface is patterned either before or after the thin layer is formed thereon.

In the process of the present invention described above, before cleaning the substrates, the patterned surface is formed in at least one surface of the first and second substrates. After the two substrates are cleaned and Van der Waals' bound together, before a portion of one of the substrates is removed, the structure is heated to a low temperature to effect gas escape from the structure. After the portion of the substrate is removed, the structure can be heated again to a low temperature to effect escape of any gas remaining entrapped by the substrates. Conditions suitable for enhancing gas escape (i.e. temperature and duration) are well known to one skilled in the art. For example, water vapor is typical of a substance that may be entrapped on the substrate after the cleaning step. It is desirable to heat the structure to a temperature less than the boiling point of water (100° C.) to enhance gas escape of the water vapor from the structure without forming additional bubbles in the structure that may occur if the structure was heated to the boiling point of water. Exemplary conditions are a temperature in the range of about 30° C. to about 90° C. for about 10 to about 30 minutes.

What is claimed:

1. A process for fabricating a device comprising the steps of:

selecting a first single crystal substrate having a first crystal lattice and a second single crystal substrate having a second crystal lattice different from the first crystal lattice wherein the second substrate has at least one single crystal device layer formed thereon;

cleaning the first surface of the first single crystal substrate and the single crystal device layer, placing the cleaned first surface in physical contact with the cleaned single crystal device layer for a duration sufficient to obtain a bond of an attractive force between the cleaned first surface and the cleaned single crystal device layer;

first heating at a low temperature of about 30° C. to about 90° C. for a duration of about 10 minutes to about 30 minutes the bonded first surface and single crystal device layer to release gas entrapped by the first single crystal substrate or the single crystal device layer;

removing the second substrate, leaving the single crystal device layer bonded to the first single crystal substrate; and heating at a high temperature the first single crystal substrate to increase the strength of the bond between the first single crystal substrate and the single crystal device layer bonded thereto.

2. The process of claim 1 further comprising the step of:

second heating at a low temperature of the first single crystal substrate bonded to the first single crystal device layer to release gas entrapped by the first single crystal substrate or the single crystal device layer after the step of removing the second substrate.

3. The process of claim 1 further comprising the step of: patterning either the first single crystal substrate or the second single crystal substrate before the step of cleaning the first surface, the pattern providing an irregular surface for allowing gas to escape when the substrates are pressed together.

4. The process of claim 1 wherein the high temperature heating is performed at a temperature of about 630° C. to about 650° C. for a duration of about 15 minutes to about 30 minutes.

5. The process of claim 1 wherein the first single crystal substrate is a silicon substrate and the second single crystal substrate is a III–V single crystal substrate with at least one III–V device layer formed thereon.

6. The process of claim 5 wherein the III–V single crystal substrate is an indium phosphide substrate and the at least one III–V device layer is selected from the group consisting of indium gallium arsenide and indium phosphide.

7. The process of claim 2 wherein the second heating at a low temperature is performed at a temperature of about 30° C. to about 90° C. for a duration of about 15 minutes to about 30 minutes.

* * * * *